US012588175B2

(12) United States Patent
Hasegawa et al.

(10) Patent No.: US 12,588,175 B2
(45) Date of Patent: Mar. 24, 2026

(54) NOISE REDUCTION TOOL AND WIRE HARNESS

(71) Applicant: Yazaki Corporation, Tokyo (JP)

(72) Inventors: Itsuki Hasegawa, Shizuoka (JP); Kaori Usami, Shizuoka (JP); Jin Watanabe, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 105 days.

(21) Appl. No.: 18/808,768

(22) Filed: Aug. 19, 2024

(65) Prior Publication Data

US 2024/0414898 A1    Dec. 12, 2024

Related U.S. Application Data

(63) Continuation of application No. PCT/JP2023/012058, filed on Mar. 25, 2023.

(30) Foreign Application Priority Data

Apr. 11, 2022    (JP) ................................. 2022-064954

(51) Int. Cl.
*H05K 9/00* (2006.01)
*H01F 1/117* (2006.01)
(Continued)

(52) U.S. Cl.
CPC .............. *H05K 9/00* (2013.01); *H01F 1/117* (2013.01); *H01F 1/375* (2013.01); *H02G 3/04* (2013.01);
(Continued)

(58) Field of Classification Search
CPC ........................ H05K 9/0098; H01F 2017/065
See application file for complete search history.

(56) References Cited

U.S. PATENT DOCUMENTS

| | | | | |
|---|---|---|---|---|
| 2007/0247271 A1* | 10/2007 | Grupa | ..................... | H01F 17/06 336/222 |
| 2009/0120681 A1* | 5/2009 | Matsuzaki | ........... | H05K 9/0098 174/350 |

(Continued)

FOREIGN PATENT DOCUMENTS

| | | |
|---|---|---|
| JP | H07-297588 A | 11/1995 |
| JP | 2000-223859 A | 8/2000 |

(Continued)

*Primary Examiner* — Hung V Ngo
(74) *Attorney, Agent, or Firm* — Sughrue Mion, PLLC

(57) ABSTRACT

A noise reduction tool includes a magnetic body that can be wound around, more than one turn around an axis of an electric wire or an electric wire bundle, the electric wire or the electric wire bundle and a fixing member that fixes, to each other, overlapping sections of a stacked portion in the magnetic body having a winding shape wound around the electric wire or the electric wire bundle and fixes the magnetic body to the electric wire or the electric wire bundle while keeping the winding shape of the magnetic body. The magnetic body is capable of changing a winding diameter according to an electric wire diameter of the electric wire or an electric wire bundle diameter of the electric wire bundle, and the fixing member fixes, to each other, the overlapping sections corresponding to a winding diameter of the magnetic body irrespective of the winding diameter.

4 Claims, 3 Drawing Sheets

(51) Int. Cl.
    *H01F 1/375*         (2006.01)
    *H01F 17/06*        (2006.01)
    *H02G 3/04*         (2006.01)
    *B60R 16/02*       (2006.01)

(52) U.S. Cl.
    CPC ........ *H05K 9/0098* (2013.01); *B60R 16/0207*
                    (2013.01); *H01F 2017/065* (2013.01)

(56)               References Cited

U.S. PATENT DOCUMENTS

| | | | |
|---|---|---|---|
| 2013/0222103 A1 * | 8/2013 | Kawai | H01F 27/02 |
| | | | 336/175 |
| 2016/0358696 A1 * | 12/2016 | Sumi | H01B 11/1016 |
| 2018/0168078 A1 * | 6/2018 | Deltor | H05K 9/0098 |
| 2019/0123530 A1 * | 4/2019 | Tokuyama | H02G 3/0468 |
| 2023/0368968 A1 * | 11/2023 | Zhang | H01F 3/10 |
| 2023/0386723 A1 * | 11/2023 | Kubo | H01F 17/06 |
| 2025/0206381 A1 * | 6/2025 | Oka | H02G 3/386 |

FOREIGN PATENT DOCUMENTS

| | | |
|---|---|---|
| JP | 2002-374090 A | 12/2002 |
| JP | 2006-313856 A | 11/2006 |

* cited by examiner

NOISE REDUCTION TOOL AND WIRE HARNESS

CROSS-REFERENCE TO RELATED APPLICATION

This application is a continuation application of International Application No. PCT/JP2023/012058 filed on Mar. 25, 2023 which claims the benefit of priority from Japanese Patent Application No. 2022-064954 filed on Apr. 11, 2022 and designating the U.S., the entire contents of which are incorporated herein by reference.

BACKGROUND OF THE INVENTION

1. Field of the Invention

The present invention relates to a noise reduction tool and a wire harness.

2. Description of the Related Art

A noise reduction tool is a member made of a magnetic material and includes, as a component, a magnetic body attached to an electric wire, through which a noise current flows, to reduce emission to the outside of radiation noise emitted from the electric wire. For example, the noise reduction tool includes two magnetic bodies (so-called ferrite cores) formed in a semi-cylindrical shape and is used in a form in which the two magnetic bodies are combined to be formed in a cylindrical shape and an electric wire is inserted through a space inside the cylinder. However, it is difficult for such a noise reduction tool using the magnetic body to be shared between electric wires having greatly different diameters and it is also difficult to share components between electric wires having greatly different diameters. Accordingly, in this technical field, a noise reduction tool capable of sharing at least components between electric wires having different diameters is desired. For example, Japanese Patent Application Laid-open No. 2002-374090 described below discloses a noise reduction tool having a chain structure in which two types of magnetic bodies are alternately arranged and one kind of cylindrical magnetic bodies adjacent to each other are coupled by an elastic member and a pin. Japanese Patent Application Laid-open No. H07-297588 described below discloses a noise reduction tool in which a plurality of trapezoidal columnar magnetic bodies are bonded to a film and the film is wound around an electric wire.

However, the noise reduction tool of Japanese Patent Application Laid-open No. 2002-374090 described above has a complicated structure because of a large number of components thereof and it is difficult to reduce cost from the viewpoint of productivity and the like. In the noise reduction tool of Japanese Patent Application Laid-open No. H07-297588 described above, since the magnetic body and the film are bonded by the adhesive, it is difficult to ensure durability from the viewpoint of heat resistance, aged deterioration, and the like.

SUMMARY OF THE INVENTION

Therefore, an object of the present invention is to provide a noise reduction tool and a wire harness that can reduce cost while ensuring durability.

In order to achieve the above mentioned object, a noise reduction tool according to one aspect of the present invention includes: a belt-like magnetic body that can be wound around, more than one turn around an axis of an electric wire or an electric wire bundle, the electric wire or the electric wire bundle in which a plurality of electric wires are bundled together; and a fixing member that fixes, to each other, overlapping sections of a stacked portion in the magnetic body having a winding shape wound around the electric wire or the electric wire bundle and fixes the magnetic body to the electric wire or the electric wire bundle while keeping the winding shape of the magnetic body, wherein the magnetic body is capable of changing a winding diameter according to an electric wire diameter of the electric wire or an electric wire bundle diameter of the electric wire bundle, and the fixing member fixes, to each other, the overlapping sections corresponding to a winding diameter of the magnetic body irrespective of the winding diameter.

In order to achieve the above mentioned object, a wire harness according to another aspect of the present invention includes: an electric wire or an electric wire bundle in which a plurality of electric wires are bundled together; and a noise reduction tool that reduces emission to an outside of radiation noise emitted from the electric wire or the electric wire bundle, wherein the noise reduction tool includes: a belt-like magnetic body that can be wound around, more than one turn around an axis of the electric wire or the electric wire bundle, the electric wire or the electric wire bundle; and a fixing member that fixes, to each other, overlapping sections of a stacked portion in the magnetic body having a winding shape wound around the electric wire or the electric wire bundle and fixes the magnetic body to the electric wire or the electric wire bundle while keeping the winding shape of the magnetic body, the magnetic body is capable of changing a winding diameter according to an electric wire diameter of the electric wire or an electric wire bundle diameter of the electric wire bundle, and the fixing member fixes, to each other, the overlapping sections corresponding to a winding diameter of the magnetic body irrespective of the winding diameter.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An embodiment of a noise reduction tool and a wire harness according to the present invention is explained in detail below with reference to the drawings. Note that the present invention is not limited by the embodiment.

EMBODIMENT

One of embodiments of the noise reduction tool and the wire harness according to the present invention is explained with reference to FIG. 1 to FIG. 6.

Figure 1:
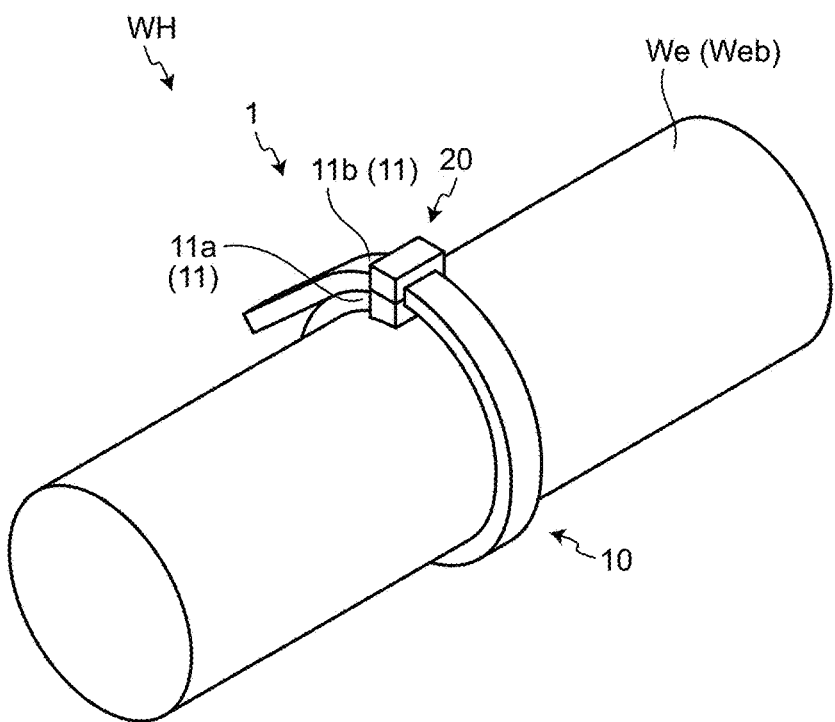
FIG. 1 is a perspective view schematically illustrating a wire harness to which a noise reduction tool in an embodiment is assembled.
Figure 2:
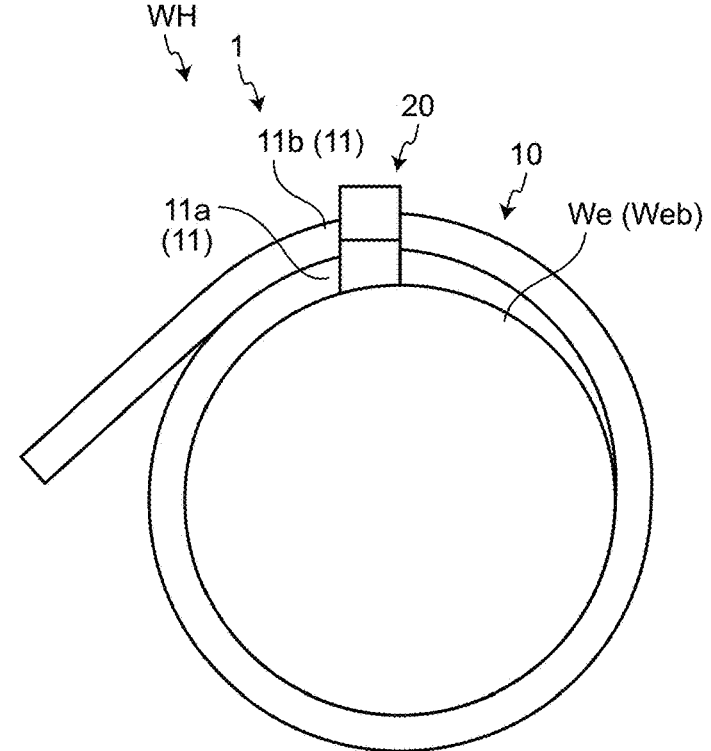
FIG. 2 is a schematic diagram in which the wire harness to which the noise reduction tool in the embodiment is assembled is viewed in an axial direction.

Reference numeral 1 illustrated in FIG. 1 and FIG. 2 denotes a noise reduction tool in the present embodiment. The noise reduction tool 1 is attached to an electric wire We, through which a noise current flows, to reduce emission to the outside of radiation noise emitted from the electric wire We. Alternatively, the noise reduction tool 1 is attached to an electric wire bundle Web in which a plurality of electric wires including the electric wire We through which the noise current flows are bundled together and reduces emission to the outside of radiation noise emitted from the electric wire bundle Web (the electric wire We through which the noise current flows among the plurality of electric wires). Reference numeral WH illustrated in FIG. 1 and FIG. 2 denotes a wire harness in which the noise reduction tool 1 is assembled to the electric wire We or the electric wire bundle Web. One or a plurality of noise reduction tools 1 are provided according to the length of the electric wire We or the electric wire bundle Web.

The wire harness WH is mounted on an electric automobile (not illustrated) such as a BEV (Battery Electric Vehicle) or a PHEV (Plug-in Hybrid Electric Vehicle). As a specific example, the wire harness WH physically and electrically connects, between a secondary battery for driving and a secondary battery for auxiliary machine of the electric automobile, a DC/DC converter interposed between the secondary battery for driving and the secondary battery for auxiliary machine and the secondary battery for auxiliary machine. The wire harness WH is responsible for feeding electric power from the secondary battery for driving to the secondary battery for auxiliary machine when the secondary battery for auxiliary machine is charged.

The wire harness WH is used, for example, in a charging system (not illustrated) for charging the secondary battery for driving and the secondary battery for auxiliary machine of the electric automobile.

The charging system is configured as a charging system for normal charging or rapid charging irrespective of whether the charging system is for business use or home use. The charging system includes an external power supply, a charger main body to which electric power is supplied from the external power supply, and a charging cable with connector for feeding electric power from the charger main body to the vehicle side. The charging cable with connector is used by an operator when power is supplied, and includes a charging cable provided with at least a power line (electric wire We) and a charging connector attached to one terminal of the charging cable. Here, as the charging systems, there is also a charging system that performs charging control while performing communication between the vehicle and the charger main body at the time of the power feed. The charging cable in this case is also provided with a communication signal line responsible for the communication.

For example, when the charging system is configured as a charging system for rapid charging, a three-phase AC power supply is used as the external power supply and an AC/DC converter that converts an AC voltage of the three-phase AC power supply into a DC voltage is housed in a housing of the charger main body. The charging cable with connector in this case supplies electric power the conversion to the vehicle side.

The charging cable with connector is assembled to the charger main body in advance and may configure a charger in conjunction with the charger main body. The charging cable with connector is routed from the charger main body side to the vehicle side at the time of charging and physically and electrically connects the charging connector to a connector of the electric automobile (a vehicle-side connector).

On the other hand, the charging cable with connector is an independent component housed in a luggage room of the vehicle. A power supply-side connector may be attached to the other terminal of the charging cable. In this case, the charger main body configures the charger. When charging is performed, the charging cable with connector physically and electrically connect the power supply-side connector to the connector of the charger main body and physically and electrically connect the charging connector to the vehicle-side connector.

In this charging system, an internal charging cable for electrically connecting the AC/DC converter side and the charging cable side is provided in a housing of the charger main body. The internal charging cable includes at least an internal power line (the electric wire We). The AC/DC converter side and the charging cable side are electrically connected by the internal power line. Therefore, in the charging system, the wire harness WH in the present embodiment is obtained by attaching the noise reduction tool 1 to the internal charging cable. When the communication described above is performed in the charging, an internal communication signal line is also provided in the internal charging cable. In this charging system, the wire harness WH in the present embodiment is obtained by attaching the noise reduction tool 1 to the charging cable of the charging cable with connector.

In the following explanation, the noise reduction tool 1 and the wire harness WH in the present embodiment are specifically explained.

The noise reduction tool 1 includes a belt-like magnetic body 10 that can be wound around the electric wire We or the electric wire bundle Web more than one turn around the axis of the electric wire We or the electric wire bundle Web and a fixing member 20 that fixes, to each other, overlapping sections 11a and 11b of a stacked portion 11 in the magnetic body 10 having a winding shape wound around the electric wire We or the electric wire bundle Web and fixes the magnetic body 10 to the electric wire We or the electric wire bundle Web while keeping the winding shape of the magnetic body 10 (FIG. 1 to FIG. 6).

The magnetic body 10 is formed of a ferromagnetic material to have flexibility. Ferrite or the like is used as the ferromagnetic material.

The magnetic body 10 is formed into a belt shape having length corresponding to the electric wire diameter of the electric wire We to be wound or the electric wire bundle diameter of the electric wire bundle Web and having length at which the overlapping sections 11a and 11b of the stacked portion 11 can be fixed to each other by the fixing member 20 after the magnetic body 10 is wound around the electric wire We or the electric wire bundle Web more than one turn. For example, the magnetic body 10 is formed in a belt shape having length at which the magnetic body 10 can be wound around, more than one turn, the electric wire We having the maximum electric wire diameter or the electric wire bundle Web having the maximum electric wire bundle diameter to be wound and the overlapping sections 11a and 11b of the stacked portion 11 can be fixed to each other by the fixing member 20. That is, if the electric wire We has an electric wire diameter equal to or smaller than the maximum electric wire diameter or the electric wire bundle Web has an electric wire bundle diameter equal to or smaller than the maximum electric wire bundle diameter, a winding diameter of the magnetic body 10 can be changed according to the electric wire diameter of the electric wire We or the electric wire bundle diameter of the electric wire bundle Web.

The fixing member 20 is formed to be able to fix the overlapping sections 11*a* and 11*b* corresponding to the winding diameter of the magnetic body 10 to each other irrespective of the winding diameter of the magnetic body 10. Specifically, the fixing member 20 exemplified here includes a protrusion caused to bite in at least one overlapping section 11*a* (11*b*) of the stacked portion 11 to fix the overlapping sections 11*a* and 11*b* to each other.

The fixing member 20 includes a first fixing section 21 and a second fixing section 22 (FIG. 3 to FIG. 6). The first fixing section 21 and the second fixing section 22 may be separate from each other or may be integrated via a living hinge or the like. Here, the first fixing section 21 and the second fixing section 22 separate from each other are illustrated.

In the fixing member 20, a plurality of protrusions are provided in at least one of the first fixing section 21 and the second fixing section 22. For example, in the fixing member 20, a plurality of protrusions are provided in one of the first fixing section 21 and the second fixing section 22, and a clamping section that clamps at least one overlapping section 11*a* (11*b*) with the protrusions is provided on the other of the first fixing section 21 and the second fixing section 22. The clamping section may be a wall surface such as a smooth surface of the other of the first fixing section 21 and the second fixing section 22 or may be a groove for each of protrusions paired with the protrusions.

Figure 4:
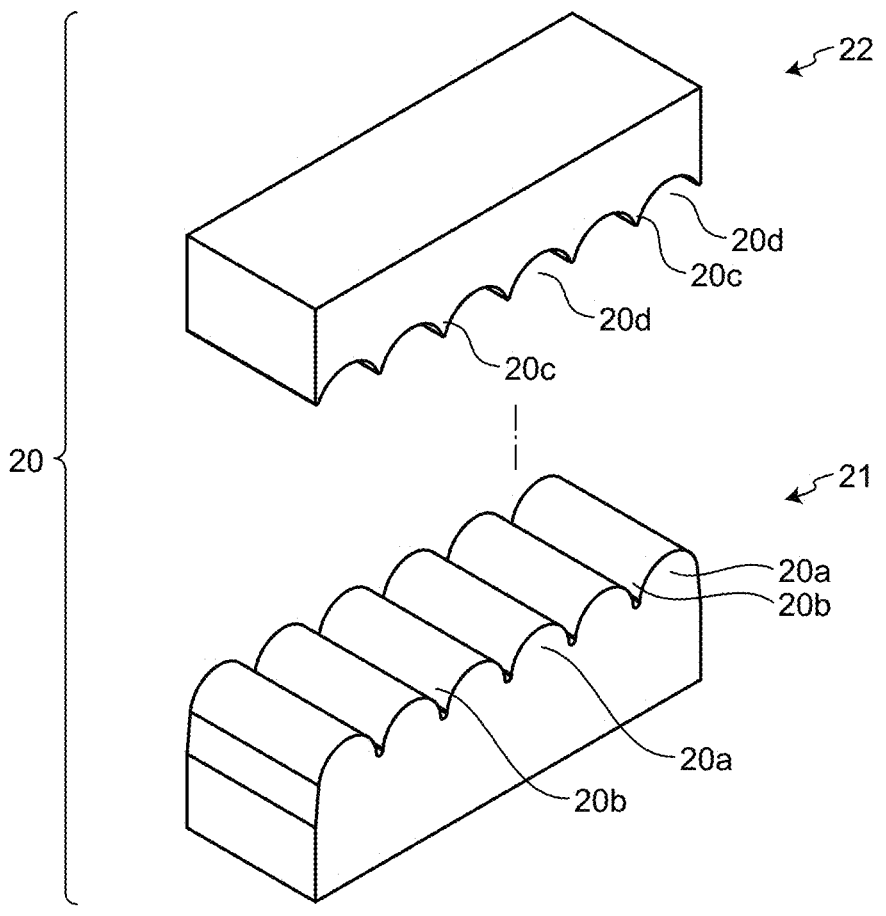
FIG. 4 is a perspective view schematically illustrating an example of a fixing member.

The first fixing section 21 explained here includes a plurality of first protrusions 20*a* and a plurality of first grooves 20*b* alternately arranged (FIG. 4). On the other hand, the second fixing section 22 explained here includes a plurality of second protrusions 20*c* and a plurality of second grooves 20*d* alternately arranged (FIG. 4). In the fixing member 20, one first protrusion 20*a* and one second groove 20*d* are paired and one second protrusion 20*c* and one first groove 20*b* are paired. The first protrusion 20*a* and the second groove 20*d* are formed, for each combination thereof, in shapes that enable the first protrusion 20*a* to enter the second groove 20*d*. The second protrusion 20*c* and the first groove 20*b* are formed, for each combination thereof, in shapes that enable the second protrusion 20*c* to enter the first groove 20*b*.

Figure 3:
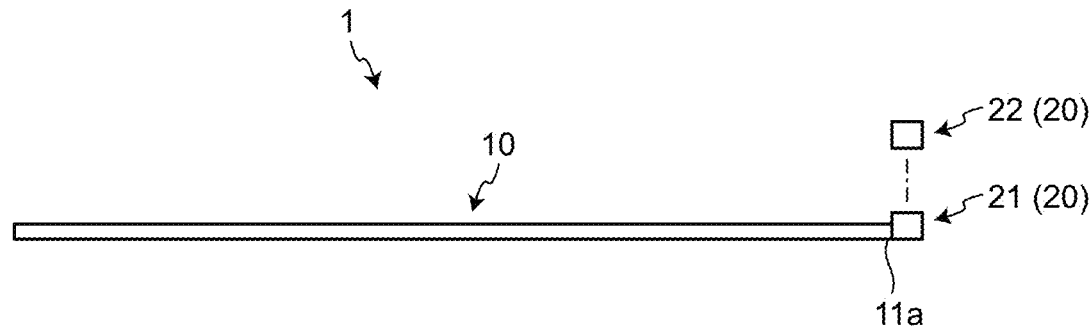
FIG. 3 is a plan view schematically illustrating the noise reduction tool before assembly.

In the fixing member 20, the first fixing section 21 is integrated with one end portion in the longitudinal direction of the magnetic body 10 (FIG. 3). In this case, in the magnetic body 10, one end portion thereof is one overlapping section 11*a*. The other overlapping section 11*b* is present on the other end portion side in the longitudinal direction of the magnetic body 10 after winding. For example, if the shape of the first fixing section 21 can be formed, the first fixing section 21 may be formed of the same ferromagnetic material as the ferromagnetic material of the magnetic body 10 to be integral with the magnetic body 10. For example, if an integral molding technique such as insert molding or two-color molding can be applied between the first fixing section 21 and the magnetic body 10, the first fixing section 21 only has to be formed of an insulative material such as synthetic resin using the integral molding technique.

Figure 5:
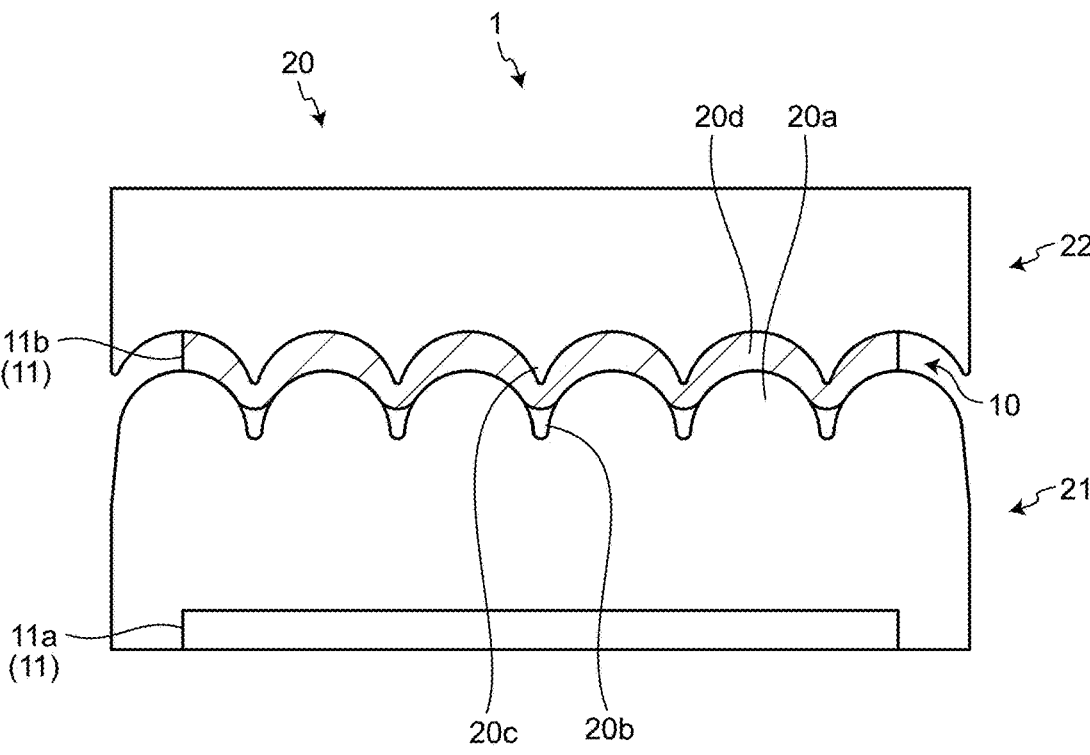
FIG. 5 is a plan view schematically illustrating a fixed state of overlapping sections by the fixing member together with an example of the fixed state.

In the noise reduction tool 1, the magnetic body 10 is wound around the electric wire We or the electric wire bundle Web and the other end portion side of the magnetic body 10 is superimposed on the first fixing section 21 in the overlapping section 11*a* (one end portion) of the magnetic body 10. Here, a portion superimposed on the first fixing section 21 on the other end portion side of the magnetic body 10 is the overlapping section 11*b*. In the fixing member 20, the overlapping section 11*b* is clamped between the first fixing section 21 and the second fixing section 22 of the overlapping section 11*a* and, for each combination of the first protrusion 20*a* and the second groove 20*d*, the first protrusion 20*a* is caused to bite in the overlapping section 11*b* between the first protrusion 20*a* and the second groove 20*d*, and, for each combination of the second protrusion 20*c* and the first groove 20*b*, the second protrusion 20*c* is caused to bite in the overlapping section 11*b* between the second protrusion 20*c* and the first groove 20*b*, whereby the overlapping sections 11*a* and 11*b* are fixed to each other (FIG. 5).

Figure 6:
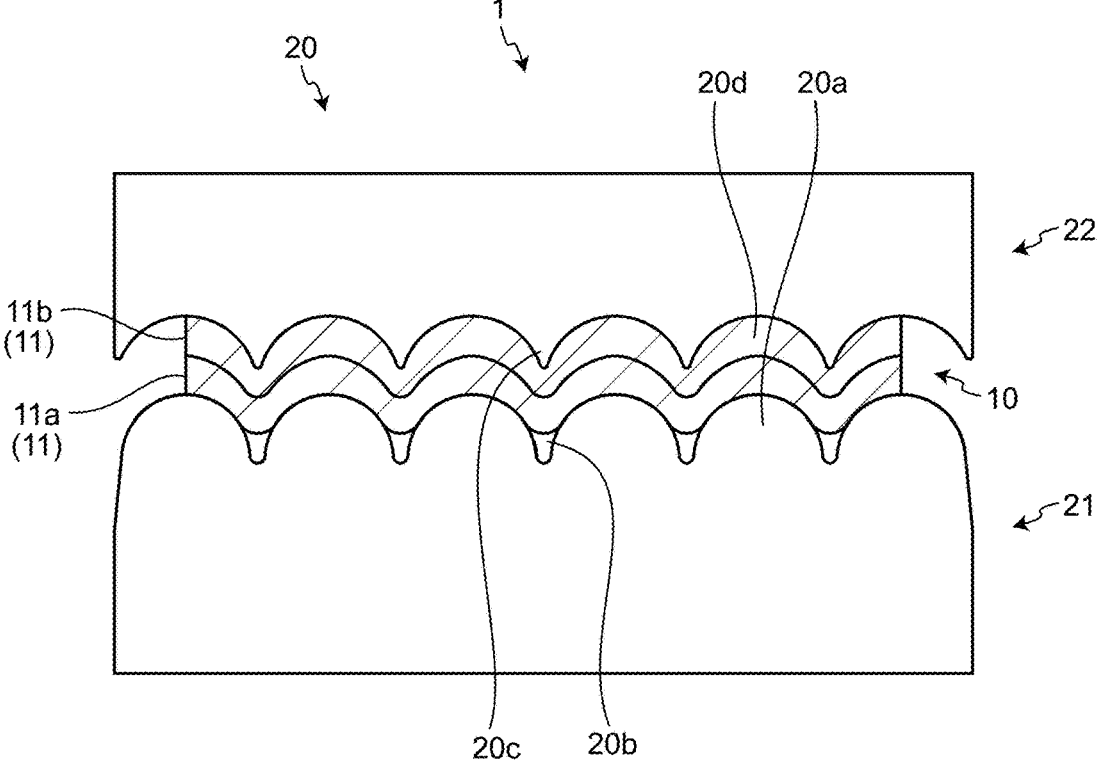
FIG. 6 is a plan view schematically illustrating the fixed state of the overlapping sections by the fixing member together with another example of the fixed state.

In the fixing member 20, in order to keep the biting state in the overlapping section 11*b*, at least two lock mechanisms for fixing the first fixing section 21 and the second fixing section 22 to each other are provided between the first fixing section 21 and the second fixing section 22 (not illustrated). The lock mechanism includes, for example, a claw-like first engaging section provided in the first fixing section 21 and a second engaging section provided in the second fixing section 22, the claw-like first engaging section being caught by the second engaging section to fix the first fixing section 21 and the second fixing section 22 in the biting state in the overlapping section 11*b*. When the first fixing section 21 and the second fixing section 22 are integrated by the living hinge or the like described above, at least one lock mechanism only has to be provided.

the fixing member 20 may be molded as a component different from the magnetic body 10 (FIG. 6). In this case, the fixing member 20 clamps and fixes the overlapping sections 11*a* and 11*b* of the stacked portion 11 with the first fixing section 21 and the second fixing section 22. In the fixing member 20, for each combination of the first protrusion 20*a* and the second groove 20*d*, the first protrusion 20*a* is caused to bite in the overlapping sections 11*a* and 11*b* between the first protrusion 20*a* and the second groove 20*d* and, for each combination of the second protrusion 20*c* and the first groove 20*b*, the second protrusion 20*c* is caused to bite in the overlapping sections 11*a* and 11*b* between the second protrusion 20*c* and the first groove 20*b*, whereby the overlapping sections 11*a* and 11*b* are fixed to each other. In the fixing member 20 as well, in order to keep a biting state in the overlapping sections 11*a* and 11*b*, a lock mechanism for fixing the first fixing section 21 and the second fixing section 22 to each other is provided between the first fixing section 21 and the second fixing section 22.

As explained above, the noise reduction tool 1 in the present embodiment adopts a simple structure in which main components are only the magnetic body 10 and the fixing member 20 and the magnetic body 10 is wound around the electric wire We or the electric wire bundle Web and fixed by the fixing member 20. Accordingly, the noise reduction tool 1 is excellent in productivity and can reduce cost. Since the noise reduction tool 1 can be adapted to the electric wires We having various electric wire diameters and lengths and the electric wire bundles Web having various electric wire bundle diameters and lengths, the noise reduction tool 1 can be shared among varieties of electric wires We and the electric wire bundles Web. Therefore, this noise reduction tool 1 can also achieve a reduction in cost in this respect. Since the noise reduction tool 1 also has a function of bundling the plurality of electric wires We as the electric wire bundle Web, for example, a binding band or an adhesive tape for bundling the plurality of electric wires We can be made unnecessary and a quantity and a usage amount of the binding band or the adhesive tape can be reduced. Therefore, this noise reduction tool 1 can also achieve a reduction in cost in this respect. Further, since an adhesive is not used, the noise reduction tool 1 has high heat resistance, is resistant to aged deterioration, and can ensure high durability. As explained above, the noise reduction tool 1 according to the present embodiment can keep cost low while ensuring high durability. Therefore, application of the noise reduction tool 1 to the electric automobile and the charging system described above (irrespective of whether the electric automobile and the charging system are for normal charging or rapid charging) contributes to the spread of the electric automobile and the charging system because the application makes it possible to ensure high durability and a cost reduction in the electric automobile and the charging system. The wire harness WH in the present embodiment includes the noise reduction tool 1 and can achieve the same effects as the effects obtained by the noise reduction tool 1.

Further, a possibility of occurrence of noise is higher in the charging system configured as the charging system for rapid charging than in the charging system configured as the charging system for normal charging. Therefore, the noise reduction tool 1 and the wire harness WH in the present embodiment are particularly useful in a charging system for rapid charging and an electric automobile using the charging system and capable of rapid charging.

The noise reduction tool according to the present embodiment adopts a simple structure in which main components thereof are only the magnetic body and the fixing member and the magnetic body is wound around the electric wire or the electric wire bundle and fixed by the fixing member. Accordingly, this noise reduction tool is excellent in productivity and can achieve a reduction in cost. Since the noise reduction tool can be adapted to electric wires having various electric wire diameters and lengths and electric wire bundles having various electric wire bundle diameters and lengths, the noise reduction tool can be shared among varieties of electric wires and electric wire bundles. Therefore, this noise reduction tool can also achieve a reduction in cost in this respect. Since the noise reduction tool also has a function of bundling a plurality of electric wires as an electric wire bundle, for example, a binding band or an adhesive tape for bundling the plurality of electric wires can be made unnecessary and a quantity and a usage amount of the binding band or the adhesive tape can be reduced. Therefore, this noise reduction tool can also achieve a reduction in cost in this respect. Further, since an adhesive is not used, the noise reduction tool has high heat resistance, is resistant to aged deterioration, and can ensure high durability. As explained above, the noise reduction tool according to the present embodiment can keep cost low while ensuring high durability. The wire harness according to the present embodiment includes the noise reduction tool and can achieve the same effects as the effects obtained by the noise reduction tool.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A noise reduction tool comprising:
a belt-like magnetic body that can be wound around, more than one turn around an axis of an electric wire or an electric wire bundle, the electric wire or the electric wire bundle in which a plurality of electric wires are bundled together; and
a fixing member that fixes, to each other, overlapping sections of a stacked portion in the magnetic body having a winding shape wound around the electric wire or the electric wire bundle and fixes the magnetic body to the electric wire or the electric wire bundle while keeping the winding shape of the magnetic body, wherein
the magnetic body is capable of changing a winding diameter according to an electric wire diameter of the electric wire or an electric wire bundle diameter of the electric wire bundle,
the fixing member fixes, to each other, the overlapping sections corresponding to a winding diameter of the magnetic body irrespective of the winding diameter, and has a first fixing section that is integrated with one of the overlapping section and a second fixing section that clamps an other of the overlapping section between the first fixing section and the second fixing section,
the first fixing section includes a plurality of first protrusions and a plurality of first grooves alternately arranged,
the second fixing section includes a plurality of second protrusions and a plurality of second grooves alternately arranged,
the plurality of first protrusions and the plurality of second grooves are paired one by one and, for each combination of the first protrusion and the second groove, the first protrusion is caused to bite in the other of the overlapping section between the first protrusion and the second groove, and
the plurality of second protrusions and the plurality of first grooves are paired one by one and, for each combination of the second protrusion and the first groove, the second protrusion is caused to bite in the other of the overlapping section between the first protrusion and the second groove.

2. A noise reduction tool comprising:
a belt-like magnetic body that can be wound around, more than one turn around an axis of an electric wire or an electric wire bundle, the electric wire or the electric wire bundle in which a plurality of electric wires are bundled together; and
a fixing member that fixes, to each other, overlapping sections of a stacked portion in the magnetic body having a winding shape wound around the electric wire or the electric wire bundle and fixes the magnetic body to the electric wire or the electric wire bundle while keeping the winding shape of the magnetic body, wherein
the magnetic body is capable of changing a winding diameter according to an electric wire diameter of the electric wire or an electric wire bundle diameter of the electric wire bundle, the fixing member fixes, to each other, the overlapping sections corresponding to a winding diameter of the magnetic body irrespective of the winding diameter, and has a first fixing section and a second fixing section that clamp one of overlapping section and the an other of the overlapping section, the first fixing section includes a plurality of first protrusions and a plurality of first grooves alternately arranged, the second fixing section includes a plurality of second protrusions and a plurality of second grooves alternately arranged, the plurality of first protrusions and the plurality of second grooves are paired one by one and, for each combination of the first protrusion and the second groove, the first protrusion is caused to bite in the other of the overlapping section between the first protrusion and the second groove, and the plurality of second protrusions and the plurality of first grooves are paired one by one and, for each combination of the second protrusion and the first groove, the second protrusion is caused to bite in the other of the overlapping section between the first protrusion and the second groove.

3. A wire harness comprising:

an electric wire or an electric wire bundle in which a plurality of electric wires are bundled together; and a noise reduction tool that reduces emission to an outside of radiation noise emitted from the electric wire or the electric wire bundle, wherein the noise reduction tool includes:

a belt-like magnetic body that can be wound around, more than one turn around an axis of the electric wire or the electric wire bundle, the electric wire or the electric wire bundle; and a fixing member that fixes, to each other, overlapping sections of a stacked portion in the magnetic body having a winding shape wound around the electric wire or the electric wire bundle and fixes the magnetic body to the electric wire or the electric wire bundle while keeping the winding shape of the magnetic body, the magnetic body is capable of changing a winding diameter according to an electric wire diameter of the electric wire or an electric wire bundle diameter of the electric wire bundle, the fixing member fixes, to each other, the overlapping sections corresponding to a winding diameter of the magnetic body irrespective of the winding diameter, and has a first fixing section that is integrated with one of the overlapping section and a second fixing section that clamps an other of the overlapping section between the first fixing section and the second fixing section, the first fixing section includes a plurality of first protrusions and a plurality of first grooves alternately arranged, the second fixing section includes a plurality of second protrusions and a plurality of second grooves alternately arranged, the plurality of first protrusions and the plurality of second grooves are paired one by one and, for each combination of the first protrusion and the second groove, the first protrusion is caused to bite in the other of the overlapping section between the first protrusion and the second groove, and the plurality of second protrusions and the plurality of first grooves are paired one by one and, for each combination of the second protrusion and the first groove, the second protrusion is caused to bite in the other of the overlapping section between the first protrusion and the second groove.

4. A wire harness comprising:

an electric wire or an electric wire bundle in which a plurality of electric wires are bundled together; and a noise reduction tool that reduces emission to an outside of radiation noise emitted from the electric wire or the electric wire bundle, wherein the noise reduction tool includes:

a belt-like magnetic body that can be wound around, more than one turn around an axis of the electric wire or the electric wire bundle, the electric wire or the electric wire bundle; and a fixing member that fixes, to each other, overlapping sections of a stacked portion in the magnetic body having a winding shape wound around the electric wire or the electric wire bundle and fixes the magnetic body to the electric wire or the electric wire bundle while keeping the winding shape of the magnetic body, the magnetic body is capable of changing a winding diameter according to an electric wire diameter of the electric wire or an electric wire bundle diameter of the electric wire bundle, the fixing member fixes, to each other, the overlapping sections corresponding to a winding diameter of the magnetic body irrespective of the winding diameter, and has a first fixing section and a second fixing section that clamp one of overlapping section and the an other of the overlapping section, the first fixing section includes a plurality of first protrusions and a plurality of first grooves alternately arranged, the second fixing section includes a plurality of second protrusions and a plurality of second grooves alternately arranged, the plurality of first protrusions and the plurality of second grooves are paired one by one and, for each combination of the first protrusion and the second groove, the first protrusion is caused to bite in the other of the overlapping section between the first protrusion and the second groove, and the plurality of second protrusions and the plurality of first grooves are paired one by one and, for each combination of the second protrusion and the first groove, the second protrusion is caused to bite in the other of the overlapping section between the first protrusion and the second groove.

\* \* \* \* \*